US012775023B2

(12) United States Patent
Moriya et al.

(10) Patent No.: US 12,775,023 B2
(45) Date of Patent: Oct. 27, 2026

(54) CONNECTION ASSEMBLY AND INSPECTION DEVICE

(71) Applicant: Tokyo Electron Limited, Tokyo (JP)

(72) Inventors: Hidesumi Moriya, Yamanashi (JP); Hiroaki Hayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 257 days.

(21) Appl. No.: 18/713,446

(22) PCT Filed: Nov. 29, 2023

(86) PCT No.: PCT/JP2023/042718
§ 371 (c)(1),
(2) Date: May 24, 2024

(87) PCT Pub. No.: WO2024/127993
PCT Pub. Date: Jun. 20, 2024

(65) Prior Publication Data
US 2026/0169030 A1 Jun. 18, 2026

(30) Foreign Application Priority Data
Dec. 13, 2022 (JP) ................................ 2022-198898

(51) Int. Cl.
*G01R 1/073* (2006.01)
*G01R 31/68* (2020.01)
(Continued)

(52) U.S. Cl.
CPC ............. *G01R 1/073* (2013.01); *G01R 31/68* (2020.01); *H01R 13/04* (2013.01); *H01R 13/6625* (2013.01)

(58) Field of Classification Search
CPC . H10W 90/00; H10W 90/724; H10W 90/722; H10W 70/635
See application file for complete search history.

(56) References Cited

U.S. PATENT DOCUMENTS 5,172,051 A * 12/1992 Zamborelli ........ G01R 1/06772 324/149
6,348,810 B1 * 2/2002 Yanagawa .......... G01R 1/07378 324/754.03
(Continued)

FOREIGN PATENT DOCUMENTS

JP 2020-064914 4/2020
KR 10-0663270 1/2007
KR 10-2016-0113965 10/2016

*Primary Examiner* — Huy Q Phan
*Assistant Examiner* — Temilade S Rhodes-Vivour
(74) *Attorney, Agent, or Firm* — IPUSA, PLLC

(57) ABSTRACT

The connection assembly includes an intermediate connection member and a connection substrate stacked on the intermediate connection member. The intermediate connection member includes a plurality of connection pins electrically connecting a plurality of tester-side terminals and a plurality of probe card-side terminals, respectively, a first frame portion holding one end of each of the plurality of connection pins, a second frame portion holding the other end of each of the plurality of connection pins, and a housing space provided in either or both of the first frame portion and the second frame portion. The connection substrate is stacked on either or both of the first frame portion and the second frame portion having the housing space, and includes a conductive part electrically connected to the plurality of connection pins, and an electronic component electrically connected to the conductive part and disposed in the housing space.

14 Claims, 11 Drawing Sheets

(51) Int. Cl.
*H01R 13/04* (2006.01)
*H01R 13/66* (2006.01)

(56) References Cited

U.S. PATENT DOCUMENTS

| | | | | |
|---|---|---|---|---|
| 2012/0108083 | A1* | 5/2012 | Wittig .................... | H01R 4/184<br>439/78 |
| 2012/0194213 | A1* | 8/2012 | Komatsu ............ | G01R 31/2887<br>324/756.03 |
| 2020/0211913 | A1* | 7/2020 | De La Cerda ........... | G11C 5/04 |
| 2020/0343664 | A1* | 10/2020 | Sakai .................. | F21V 33/0012 |

* cited by examiner

CONNECTION ASSEMBLY AND INSPECTION DEVICE

TECHNICAL FIELD

The present disclosure relates to a connection assembly and an inspection device.

BACKGROUND ART

The inspection device brings a plurality of probes of a probe card connected to a tester into contact with a plurality of devices under test on a substrate, and performs electrical inspection of each device under test. In this kind of inspection device, the probe card is replaced in response to wear and tear or the like of a probe.

If electronic components such as a capacitor are mounted on the probe card, electronic components that can still be used are also discarded when the probe card is replaced. In order to reduce the test cost associated with the disposal of electronic components, for example, the inspection device disclosed in PTL 1 has an intermediate connection member interposed between the tester and the probe card, such that the electronic components are mounted on the intermediate connection member.

CITATION LIST

Patent Literature

[PTL 1] Japanese Patent Application Laid-Open Publication No. 2020-64914

SUMMARY OF THE INVENTION

Technical Problem

The present disclosure provides a technique for allowing application of easily and accurately mounted electronic components, thereby enabling stable replacement and use of a probe card.

Solution to the Problem

According to one aspect of the present disclosure, a connection assembly for electrically connecting a plurality of tester-side terminals of a tester and a plurality of probe card-side terminals of a probe card is provided. The connection assembly includes an intermediate connection member and a connection substrate stacked on the intermediate connection member. The intermediate connection member includes a plurality of connection pins configured to electrically connect the plurality of tester-side terminals and the plurality of probe card-side terminals respectively, a first frame portion configured to hold one end of each of the plurality of connection pins, a second frame portion configured to hold the other end of each of the plurality of connection pins, and a housing space provided in either or both of the first frame portion and the second frame portion. The connection substrate is stacked on either or both of the first frame portion and the second frame portion having the housing space, and includes a conductive part electrically connected to the plurality of connection pins, and an electronic component electrically connected to the conductive part and disposed in the housing space.

Advantageous Effects of the Invention

According to one aspect, easily and accurately mounted electronic components are applicable, and this enables stable replacement and use of a probe card.

DESCRIPTION OF EMBODIMENTS

Figure 1:
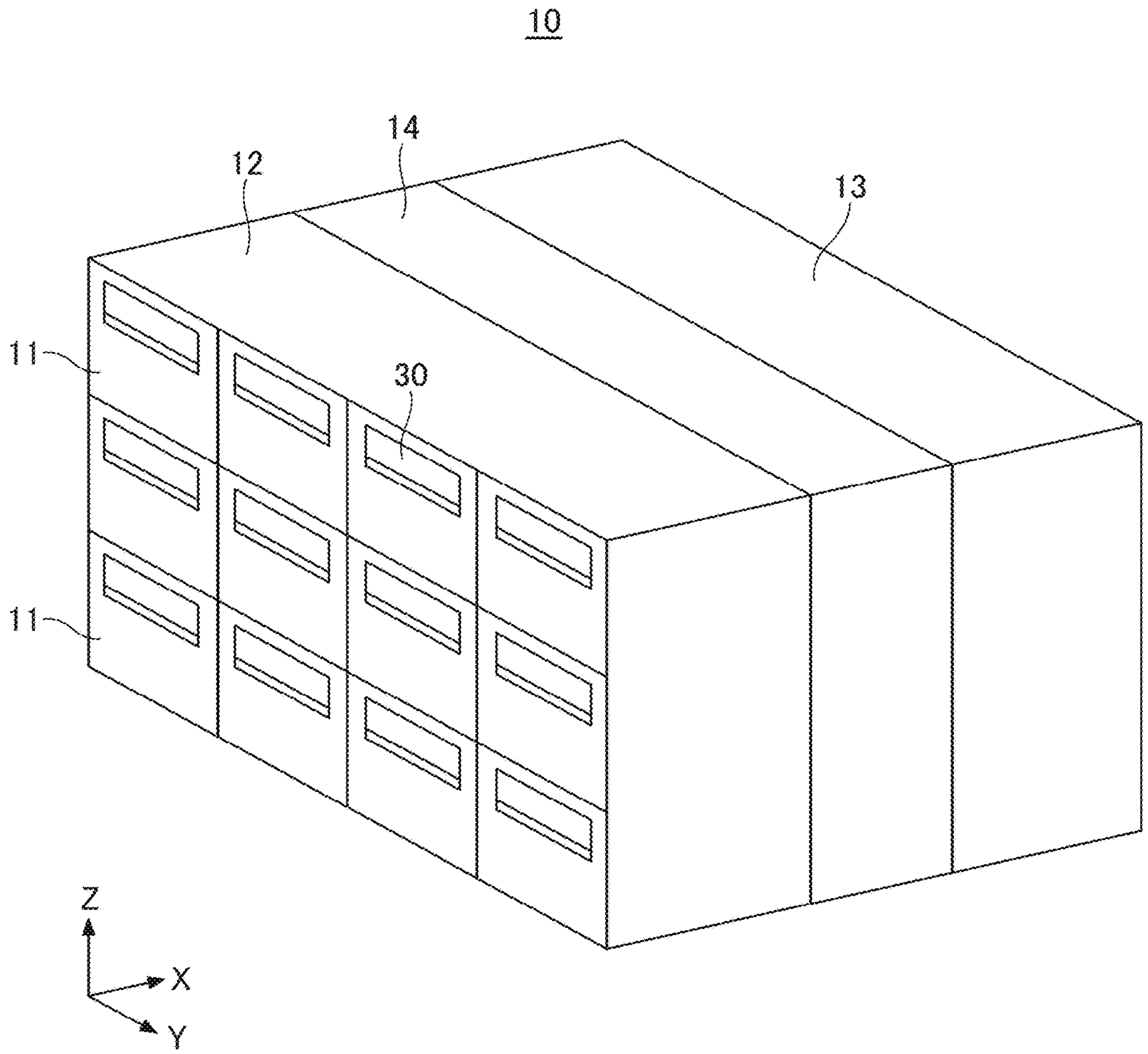
FIG. 1 is a perspective view illustrating an inspection system equipped with a plurality of inspection devices according to an embodiment.

Hereinafter, the embodiment for carrying out the present disclosure will be described with reference to the drawings. In each drawing, the same components may be denoted by the same reference numerals and duplicate descriptions may be omitted.

FIG. 1 is a perspective view illustrating a configuration example of an inspection system 10 equipped with a plurality of inspection devices according to an embodiment. The inspection system 10 is a system configured to inspect the electrical characteristics of a plurality of devices under test (DUTs) formed on a wafer, which is as an example of a substrate. The substrate is not limited to a wafer, but may be a carrier, a glass substrate, a single chip, an electronic circuit board, and the like on which the devices under test are disposed. Examples of the devices under test include semiconductor devices and other electronic devices.

The inspection system 10 includes: an inspector 12 formed in a rectangular parallelepiped shape and including a plurality of inspection chambers 11; a loader 13 for holding a plurality of wafers W before test or a plurality of wafers W after test; and a conveyor 14 provided between the inspector 12 and the loader 13. The inspector 12 includes, for example, 4 inspection chambers 11 arranged side by side in the Y-axis direction, and 3 rows of such arrangement of inspection chambers in the Z-axis direction. Each inspection chamber 11 is provided with an inspection device 20 (see FIG. 2), which will be described later.

A conveying robot (non-illustrated) capable of conveying a wafer W is provided in the conveyor 14. The conveying robot receives the wafer W before test from the loader 13 and carries it into a target inspection chamber 11 among the inspection chambers 11, and receives the wafer W after being tested in the inspection chamber 11 in which inspection has been completed and carries it into the loader 13.

Figure 2:
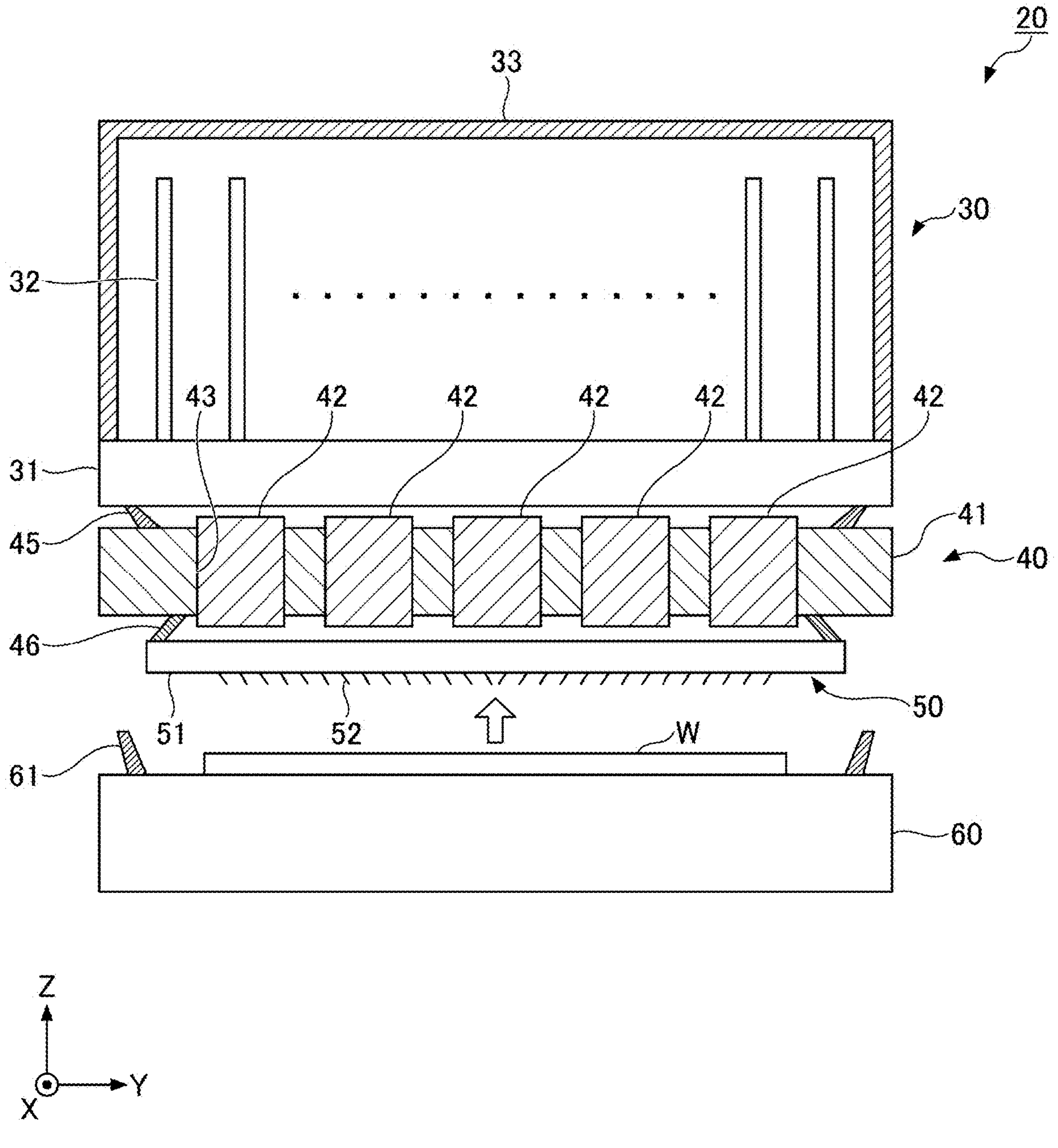
FIG. 2 is a side sectional view schematically illustrating an inspection device.

FIG. 2 is a schematic cross-sectional view illustrating the inspection device 20 provided in each inspection chamber 11 of the inspection system 10. The inspection device 20 includes a tester 30, an interface 40, and a probe card 50. The inspection device 20 electrically inspects each DUT on the wafer W by the tester 30 via a probe card 50.

The tester 30 includes a tester motherboard 31 provided horizontally, a plurality of inspection circuit boards 32 mounted in slots of the tester motherboard 31 in an upright state, and a housing 33 housing the inspection circuit boards 32. A plurality of terminals (non-illustrated) are provided at the bottom of the tester motherboard 31.

The probe card 50 has a plate-like base 51 having a plurality of terminals on the upper surface, and a plurality of probes 52 provided on the lower surface of the base 51. The plurality of probes 52 contact the DUTs on the wafer W. The wafer W is aligned in place by an aligner (non-illustrated) in the state of being adsorbed to the stage 60. Each probe 52 contacts a corresponding DUT on the wafer W in the aligned state.

The interface 40 is a member configured to electrically connect the tester 30 and the probe card 50, and includes a pogo frame 41 and connection assemblies 42 functioning as pogo blocks.

Figure 3:
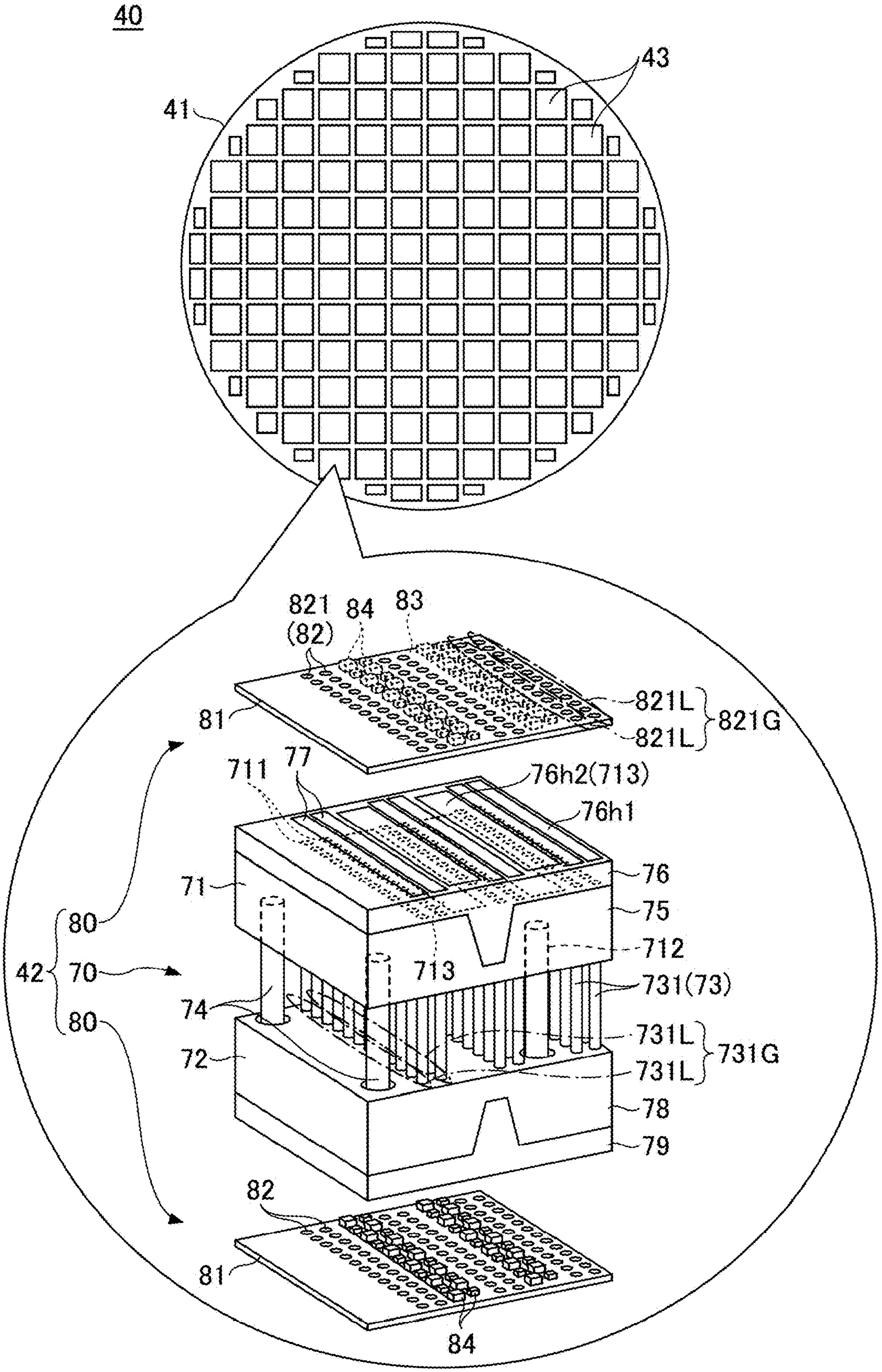
FIG. 3 is a schematic illustration of an interface provided between a tester and a probe card.

FIG. 3 is a view schematically illustrating the interface 40 provided between the tester 30 and the probe card 50. The pogo frame 41 is made of a material having a high strength, a high rigidity, and a low coefficient of thermal expansion, such as a NiFe alloy. The pogo frame 41 has a plurality of holes 43 penetrating the pogo frame in the thickness direction (Z-axis direction). The connection assemblies 42 are inserted into corresponding ones of the holes 43.

The connection assemblies 42, while being inserted into the holes 43, are aligned on the pogo frame 41 to connect the terminals of the tester motherboard 31 of the tester 30 to the terminals of the base 51 of the probe card 50. Details of the connection assemblies 42 will be described later.

Referring back to FIG. 2, the inspection device 20 includes a sealing member 45 between the tester motherboard 31 and the pogo frame 41, and includes a sealing member 46 between the pogo frame 41 and the probe card 50. The inspection device 20 adsorbs the interface 40 to the tester motherboard 31 by vacuuming the space between the tester motherboard 31 and the interface 40 enclosed by the sealing member 45. The inspection device 20 adsorbs the probe card 50 to the interface 40 by vacuuming the space between the interface 40 and the probe card 50 enclosed by the sealing member 46.

In addition, the inspection device 20 has a sealing member 61 enclosing the wafer W on the upper surface of the stage 60. The inspection system 10 elevates the stage 60 by an aligner (non-illustrated) to bring each probe 52 of the probe card 50 into contact with the electrodes of a corresponding DUT on the wafer W. At this time, the inspection device 20 brings the sealing member 61 of the stage 60 into contact with the pogo frame 41, and vacuums the space enclosed by the sealing member 61 to attract the stage 60 to the interface 40.

First Configuration Example

Figure 4A:
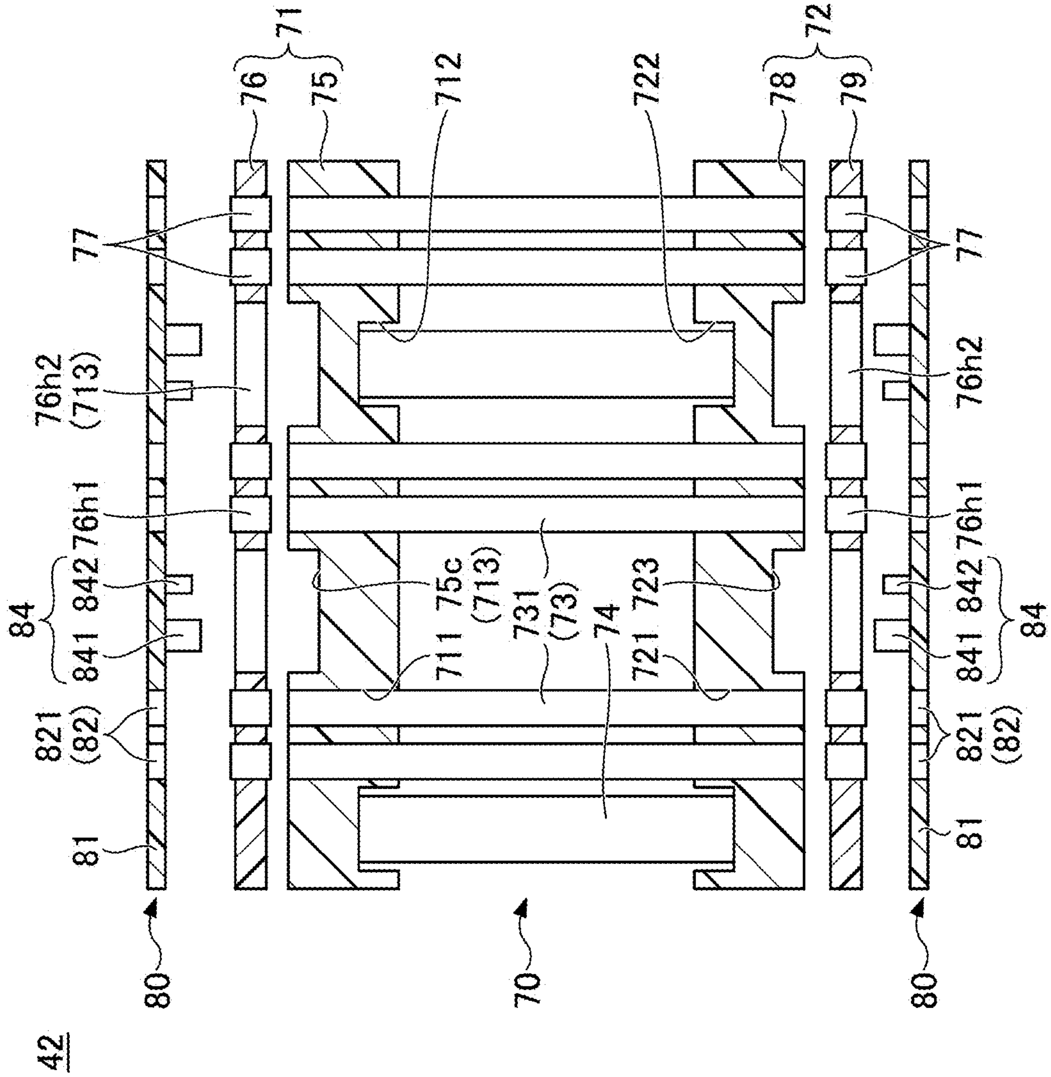
FIG. 4A is a side sectional view illustrating an exploded connection assembly according to a first configuration example.
Figure 4B:
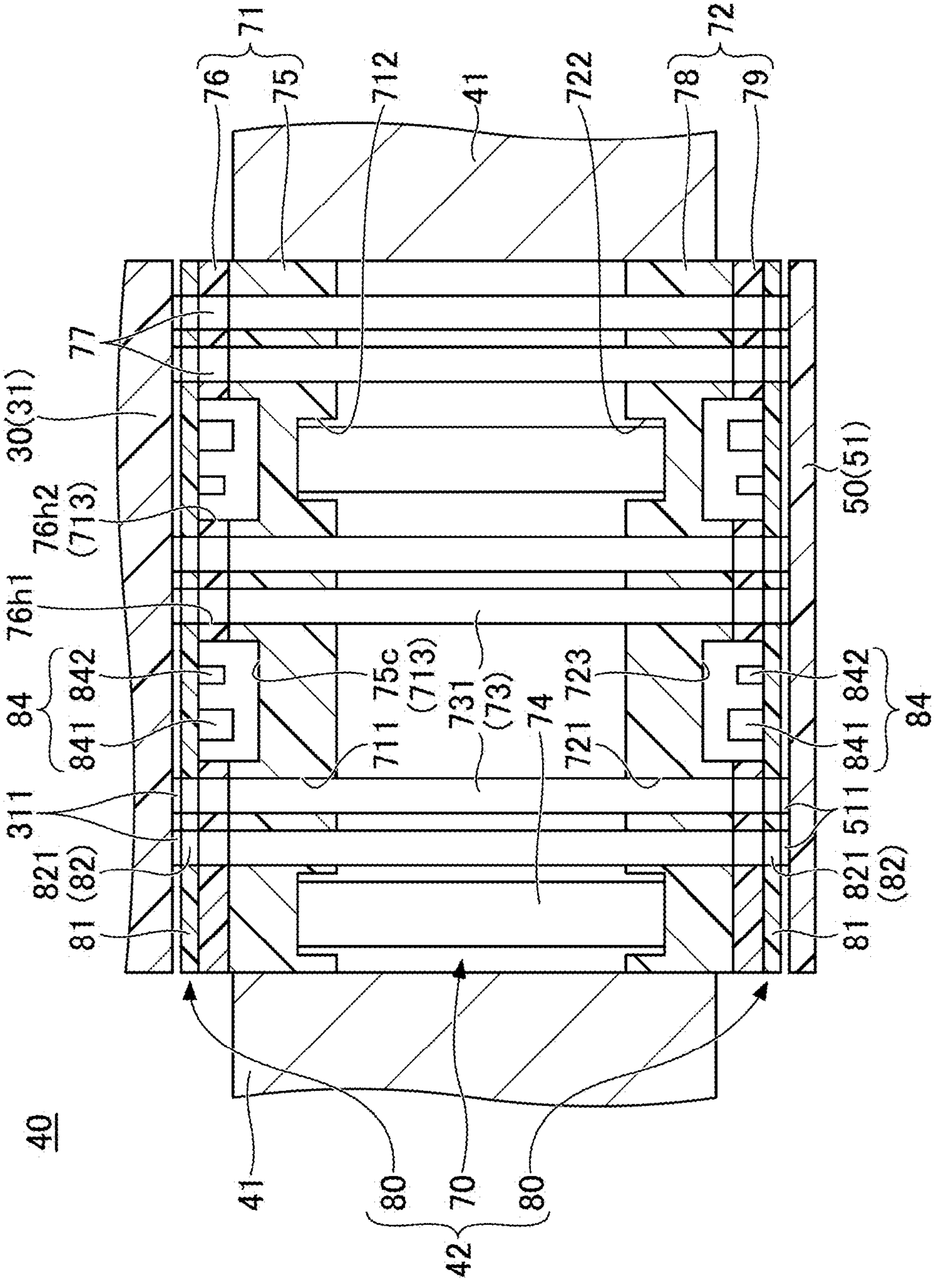
FIG. 4B is a side sectional view illustrating the installation state of the connection assembly according to the first configuration example.
Figure 5A:
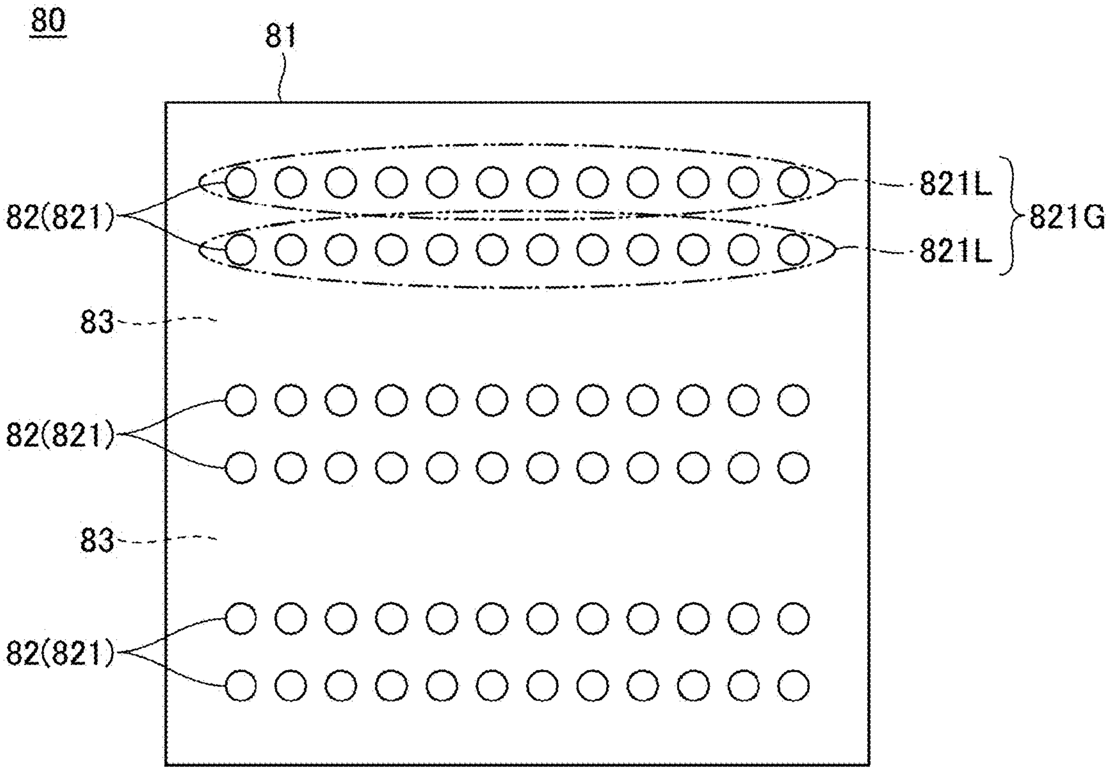
FIG. 5A is a view illustrating the upper surface of the connection substrate according to the first configuration example.
Figure 5B:
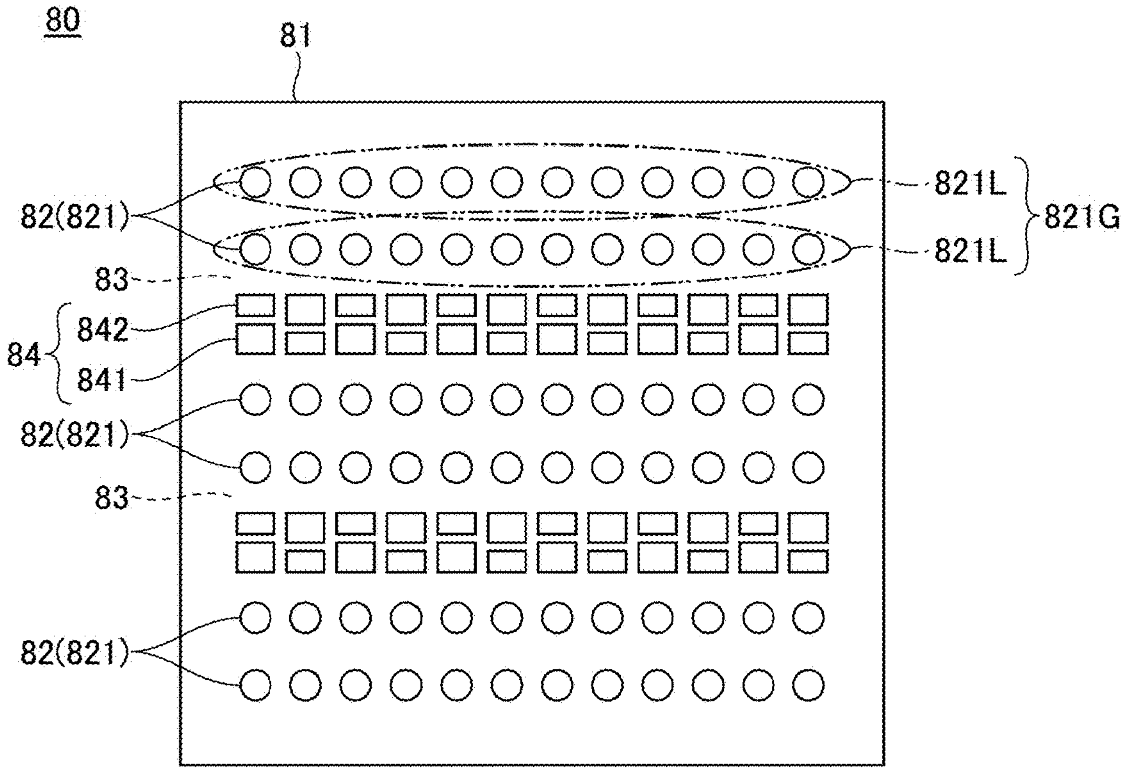
FIG. 5B is a view illustrating the lower surface of the connection substrate.

Next, the connection assembly 42 according to the first configuration example will be described with reference to FIGS. 3 to 5B. FIG. 4A is a side sectional view illustrating an exploded connection assembly 42 according to the first configuration example. FIG. 4B is a side sectional view illustrating the installation state of the connection assembly 42 according to the first configuration example. FIG. 5A is a view illustrating an upper surface of a connection substrate 80 according to the first configuration example. FIG. 5B is a view illustrating a lower surface of the connection substrate 80.

The connection assembly 42 includes an intermediate connection member 70 and two (a pair of) connection substrates 80 stacked on the upper and lower surfaces of the intermediate connection member 70. The connection substrates 80 may be set appropriately according to the circuit required for inspection of the wafer W, and the number of the connection substrates 80 may be one or more. For example, the connection assembly 42 may have one connection substrate 80 stacked only on the upper surface (one surface) of the intermediate connection member 70, or conversely, one connection substrate 80 stacked only on the lower surface (other surface) of the intermediate connection member 70.

The intermediate connection member 70 is a member inserted into the hole 43 of the pogo frame 41 and fixed on the pogo frame 41. The intermediate connection member 70 includes an upper frame portion 71 (first frame portion), a lower frame portion 72 (second frame portion), and a connection pin group 73 provided across the upper frame portion 71 and the lower frame portion 72. The connection pin group 73 includes connection pins 731 corresponding in number to tester-side terminals 311 of the tester motherboard 31 (see FIG. 4B) and to probe card-side terminals 511 of the probe card 50. In addition to the plurality of connection pins 731, the intermediate connection member 70 includes a plurality of support pins 74 supporting the upper frame portion 71 and the lower frame portion 72 between the upper frame portion 71 and the lower frame portion 72.

The upper frame portion 71 is made of a resin material having an insulating property. The upper frame portion 71 is formed in an approximately square shape in a plan view (seen from above to below) and is formed in a block shape having a suitable thickness along the vertical direction.

The lower frame portion 72 is also made of a resin material having an insulating property and is formed in a symmetrical shape with the upper frame portion 71 across the connection pin group 73. That is, the lower frame portion 72 is also formed in an approximately square shape in a plan view (arrow view from below to above) and is formed in a block shape having a suitable thickness along the vertical direction.

The connection pins 731 of the group 73 of connection pins extends linearly along the vertical direction and in parallel with each other. The connection pin group 73 has a predetermined arrangement of the plurality of connection pins 731 in a plan view. In the example of FIG. 3, the connection pin group 73 includes connection pin lines 731L in each of which a plurality of connection pins 731 are arranged linearly and at equal intervals in a first direction parallel with predetermined side surfaces of the upper frame portion 71 and the lower frame portion 72. Further, the connection pin group 73 has a sub pin group 731G in which two connection pin lines 731L are arranged to adjoin each other in a second direction orthogonal to the first direction, and a plurality of (three in FIG. 3) such sub pin groups 731G are arranged at intervals along the second direction. The connection pin group 73 can appropriately form an arrangement of the connection pins 731 in accordance with the tester-side terminals 311 of the tester 30 and the probe card-side terminals 511 of the probe card 50.

The plurality of support pins 74 are provided either near the outer periphery of the upper frame portion 71 and the lower frame portion 72 or near the center of the upper frame portion 71 and the lower frame portion 72, or both. Each support pin 74 is formed to have a greater girth than that of the connection pin 731 and is made of a material having a greater rigidity (a larger elastic modulus) than that of the connection pin 731. Thus, each support pin 74 can maintain a constant interval between the upper frame portion 71 and the lower frame portion 72.

More specifically, the upper frame portion 71 of the intermediate connection member 70 includes a plurality of connection pin holes 711 for housing the plurality of connection pins 731, a plurality of support pin holes 712 for housing the plurality of support pins 74, and a plurality of housing spaces 713 recessed downward from the upper surface of the upper frame portion 71. The upper end (one end) of each connection pin 731 is held on the inner peripheral surface of the upper frame portion 71 surrounding the connection pin holes 711 by a suitable fixing means. Examples of the fixing means include fitting, bonding, welding, and the like. Similarly, the upper end (one end) of each support pin 74 is held on the inner peripheral surface of the upper frame portion 71 surrounding the support pin hole 712 by a suitable fixing means.

The plurality of connection pin holes 711 are formed at positions corresponding to the arrangement of the connection pin group 73. The uppermost end of each connection pin 731 fixed to a corresponding connection pin hole 711 is exposed on the upper surface of the upper frame portion 71. The uppermost end of each connection pin 731 may be flush with the upper surface of the upper frame portion 71 or slightly protruded from the upper surface of the upper frame portion 71.

The plurality of support pin holes 712 are appropriately disposed in the gaps of the connection pin group 73 (for example, the outer periphery of the upper frame portion 71 and the gaps between the sub pin groups 731G).

The plurality of housing spaces 713 are provided between two adjacent sub pin groups 731G of the connection pin group 73. In the example of FIG. 3, the upper frame portion 71 includes two rectangular housing spaces 713 in a plan view. The longer sides of each housing space 713 extend along the first direction. In the example of FIG. 3, each housing space 713 is formed in a recessed shape surrounded by a side surface and a bottom surface of the upper frame portion 71. Note that the number of housing spaces 713 is not particularly limited, and may be 1 or more than 3. The planar shape of the housing spaces 713 is not particularly limited, and may be any shape such as a square shape, a circular shape, and the like. The housing spaces 713 may be through holes penetrating the upper frame portion 71.

In the examples of FIGS. 3, 4A, and 4B, the upper frame portion 71 is separable into two parts in the vertical direction. For example, the upper frame portion 71 may include a main upper frame 75 (first part) for holding the connection pin group 73 (the plurality of connection pins 731) and the plurality of support pins 74, and a sub-upper frame 76 (second part) mounted on the upper surface of the main upper frame 75. The main upper frame 75 and the sub-upper frame 76 have mutually detachably-attachable engaging mechanisms (non-illustrated), and constitute the integrated upper frame portion 71 in an engaging state. As an example of the engaging mechanism, an engaging pawl provided on one of the main upper frame 75 and the sub-upper frame 76 and an engaging hole provided in the other of them such that the engaging pawl can engage may be applied. The upper frame portion 71 may be constituted by one part that cannot be separated.

The main upper frame 75 has the connection pin holes 711 and the support pin holes 712 of the upper frame portion 71 described above, and also has convex portions 75*c* constituting the housing spaces 713. The sub-upper frame 76 has first long holes 76*h*1 at positions opposed to the connection pin holes 711 of the main upper frame 75 arranged in the first direction, and second long holes 76*h*2 at positions opposed to the recesses 75*c*. The plurality of second long holes 76*h*2 of the sub-upper frame 76 communicate with the recesses 75*c* of the sub-upper frame 76 to form the housing spaces 713 of the upper frame portion 71.

As illustrated in FIG. 4A, the plurality of first long holes 76*h*1 of the sub-upper frame 76 house elastic contact-point members 77 that have an insulating property and are elastically deformable. The elastic contact-point member 77 has a length corresponding to the first long hole 76*h*1 in a plan view. The elastic contact-point member 77 includes an elastic body made of an elastomer (synthetic rubber, natural rubber, and the like) formed in a semicircular shape in a cross-sectional view, and a plurality of conductive film lines extending along an outer arc portion of the elastic body (both non-illustrated). Each conductive film line is provided at equal intervals along the longitudinal direction (first direction) of the elastic body so as to oppose each connection pin 731 of the main upper frame 75.

The elastic contact-point member 77 is held in the sub-upper frame 76 in a state where a part of the elastic body protrudes from the upper surface and the lower surface of the sub-upper frame 76. Each conductive film line at the lower part of the elastic body protruding from the lower surface of the sub-upper frame 76 serves as a contact point electrically connected to each connection pin 731 of the main upper frame 75 in a state in which the main upper frame 75 and the sub-upper frame 76 engage with each other. Each conductive film line at the upper part of the elastic body protruding from the upper surface of the sub-upper frame 76 serves as a contact point electrically connected to each via 821 of the connection substrate 80 to be described later.

By applying the elastic contact-point member 77 to the sub-upper frame 76 in this way, the upper frame portion 71 can make each tester-side terminal 311 of the tester 30 and each connection pin 731 electrically conductive with each other while elastically deforming the elastic contact-point member 77 in accordance with the adsorption of the interface 40. Therefore, the intermediate connection member 70 can stably connect all the tester-side terminals 311 and all the connection pins 731. It should be noted that the intermediate connection member 70 is not limited to this sub-upper frame 76 configuration, and, for example, a spring pin that can be flexibly expanded and contracted in the vertical direction may be adopted as each support pin 74 to ensure flexibility, and a pogo pin that can be flexibly expanded and contracted may be applied to each connection pin 731 itself.

The connection substrate 80 stacked on the upper surface of the upper frame portion 71 has flexibility and is formed to be sufficiently thinner than the upper frame portion 71. The connection substrate 80 includes a sheet body 81, a via group 82 including a plurality of vias 821 provided through the sheet body 81 in the thickness direction, a conductive pattern 83 that is electrically conductive with each via 821, and a plurality of electronic components 84 that are electrically conductive with the conductive pattern 83. That is, the vias 821 and the conductive pattern 83 form a conductive part of the connection substrate 80 electrically connected to the plurality of electronic components 84.

A flexible substrate (polyimide film, polyester film, and the like) having an insulating property may be applied as the sheet body 81, and the sheet body 81 may have a flat shape. As illustrated in FIGS. 5A and 5B, the sheet body 81 is formed in a square shape approximately coinciding with the upper surface of the upper frame portion 71 in a plan view. The shape of the sheet body 81 is not particularly limited and may be larger than the upper surface of the upper frame portion 71 or smaller than the upper surface of the upper frame portion 71, provided that the vias 821 are provided at positions corresponding to the respective connection pins 731 of the upper frame portion 71. The sheet body 81 may be a rigid substrate, such as a glass epoxy substrate or a ceramic substrate, which is a substrate that maintains a flat shape without flexibility.

Each via 821 forming the via group 82 is made of a conductive metal material and extends short along the thickness direction of the sheet body 81. For example, the thickness of each via 821 is shorter than the diameter of each via 821. Each via 821 may be provided to protrude from either or both of the upper surface and the lower surface of the sheet body 81 and may be provided to be flush with either or both of the upper surface and the lower surface of the sheet body 81.

Each via 821 is disposed at a position opposed to each connection pin 731. That is, the via group 82 includes a via line 821L in which a plurality of vias 821 are arranged linearly and at equal intervals along the first direction. Further, the via group 82 has a sub via group 821G in which two via lines 821L are disposed to adjoin each other in the second direction orthogonal to the first direction, and a plurality (3 in FIG. 3) of such sub via groups 821G are disposed at intervals along the second direction. In the via group 82 thus constructed, the vias 821 face the connection pins 731 in a state in which the upper frame portion 71 and the connection substrate 80 are positioned in place. Therefore, the connection assembly 42 can make the connection pin groups 73 and the tester-side terminals 311 of the tester 30 electrically conductive with each other by making them contact each other through the via group 82.

The conductive pattern 83 is provided on the surface (upper surface, lower surface) of or inside the sheet body 81. The conductive pattern 83 has a suitable circuit shape for electrically connecting the vias 821 with each other, or electrically connecting with the electronic components 84 or the like according to the content of the tester 30's inspection on the wafer W.

The electronic components 84 are components mounted so as to be conductive with the conductive pattern 83 and to play a predetermined role in the inspection of the wafer W. In one embodiment, a bypass capacitor 841 configured to eliminate high frequency noise may be applied as the electronic components 84. The bypass capacitor 841 is, for example, a capacitor having a capacitance of from 1 μF to 4.7 μF. Mounting the bypass capacitor 841 in this manner makes a bypass capacitor, which hitherto has been mounted on the probe card, unnecessary.

Alternatively, a termination resistor 842 for impedance matching of the probe 52 may be applied as the electronic component 84. In this case, the termination resistor 842 may be connected to the GND via an appropriate path. The electronic component 84 is not limited to the bypass capacitor 841 and the termination resistor 842, and may be, for example, a coil, a transistor, a diode, a relay, and the like, or may be a circuit board or an integrated circuit (IC).

The connection substrate 80 according to the present embodiment is mounted with the plurality of electronic components 84 on the lower surface (back surface: one surface) of the sheet body 81 and at positions on the upper frame portion 71 facing the respective housing spaces 713. The electronic components 84 are arranged side by side in the longitudinal direction (first direction) between the sub via groups 821G. The electronic components 84 protruding from the lower surface of the sheet body 81 are disposed (housed) in the respective housing spaces 713 in a state in which the connection substrate 80 is positioned in place with respect to and stacked on the upper frame portion 71.

Therefore, as illustrated in FIG. 4B, the connection assembly 42 can prevent the upper surface of the connection assembly 42 (the connection substrate 80) from being partially raised and the vias 821 from being displaced, even when the connection substrate 80 having the electronic components 84 is stacked on the intermediate connection member 70. Thus, the connection assembly 42 can satisfactorily connect the tester-side terminals 311 of the tester 30 to the connection pins 731 through the connection substrate 80 without increasing the overall thickness.

In the connection assembly 42, the lower frame portion 72 and the connection substrate 80 stacked on the lower frame portion 72 may have the same configurations as those of the upper frame portion 71 and the connection substrate 80 stacked on the upper frame portion 71. That is, the lower frame portion 72, like the upper frame portion 71, includes a plurality of connection pin holes 721, a plurality of support pin holes 722 for housing the plurality of support pins 74, and a plurality of housing spaces 723 recessed upward from the lower surface of the lower frame portion 72. Further, the lower frame portion 72 may be a structure separable into two parts in the vertical direction (main lower frame 78, and sub-lower frame 79). Further, the connection substrate 80 stacked on the lower surface of the lower frame portion 72 includes a sheet body 81, a via group 82 including a plurality of vias 821, a conductive pattern 83 conductive with each via 821, and a plurality of electronic components 84 conductive with the conductive pattern 83. Each via 821 of the connection substrate 80 stacked on the lower surface of the lower frame portion 72 makes each probe card-side terminal 511 of the probe card 50 (base 51) conductive with a corresponding connection pin 731.

As described above, the connection assembly 42 according to the first embodiment includes the intermediate connection member 70 and the connection substrate 80 stacked on either or both of the upper surface and the lower surface of the intermediate connection member 70. As a result, the connection assembly 42 enable easy mounting of the electronic component 84 on the flat (two-dimensional) connection substrate 80, and can improve manufacturing efficiency, mounting accuracy, and the like, compared with a case of mounting the electronic component 84 on the three-dimensional intermediate connection member 70.

Mounting the electronic component 84 on the connection substrate 80 makes the electronic component, which has hitherto been mounted on the probe card, unnecessary. Accordingly, the probes 52 can be arranged at a high density on the probe card 50, which needs fewer components to be mounted on. Moreover, since recycled use of the connection substrate 80 is easy, the cost associated with replacing the probe card 50 when the probes 52 have worn is greatly reduced.

Moreover, since the connection assembly 42 is mounted with the electronic components 84 in the housing spaces 713 and 723 of the intermediate connection member 70, the connection substrates 80 can be maintained in a flat state. Therefore, the connection assembly 42 can provide a good conduction between the tester-side terminals 311 of the tester 30 and the probe card-side terminals 511 of the probe card 50 through the connection pins 731 of the intermediate connection member 70 and the vias 821 of the connection substrates 80.

It should be noted that the inspection device 20 and the connection assembly 42 according to the present disclosure are not limited to the above embodiment, and that various configuration examples and modification examples are applicable. For example, the shapes of the intermediate connection member 70 and the connection substrates 80 are not limited to being formed in an approximately square shape in a plan view, and may be rectangular, circular, and the like.

Second Configuration Example

Figure 6:
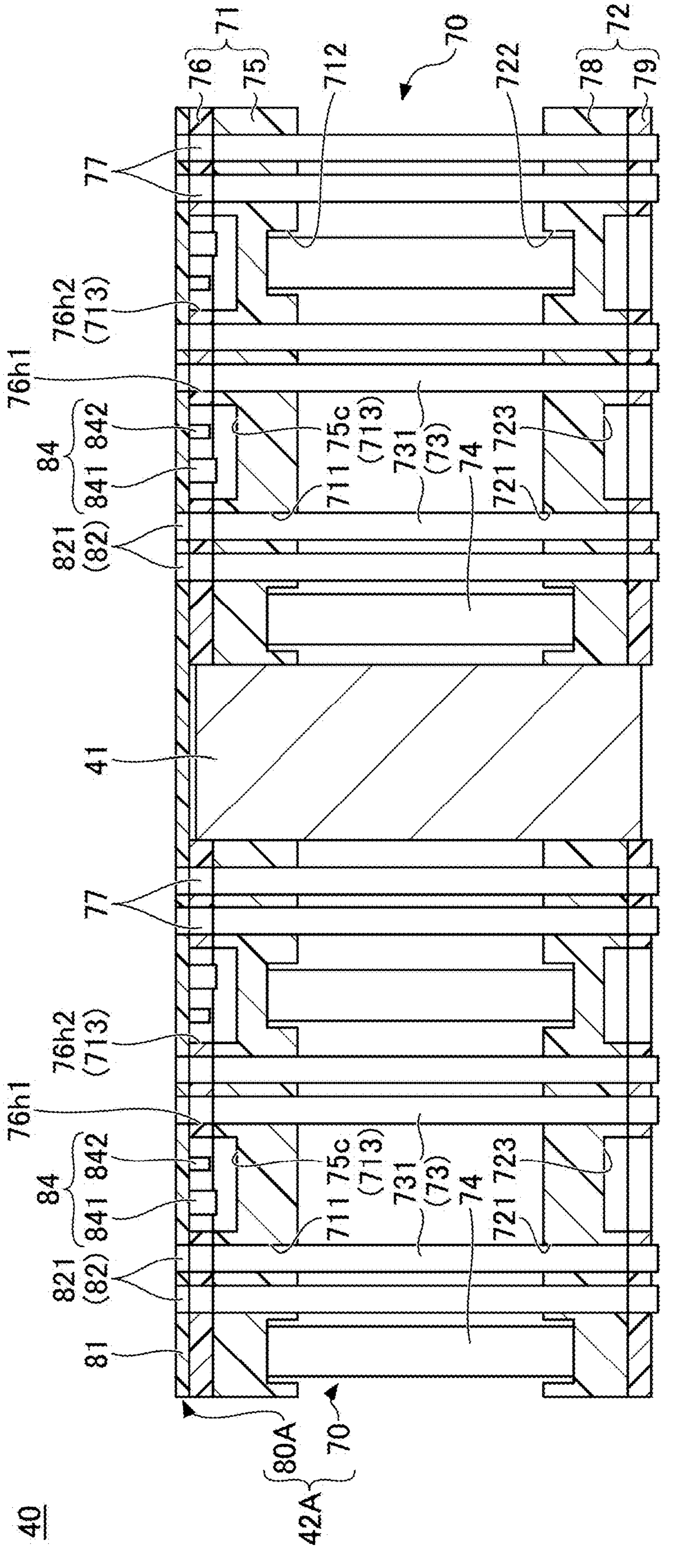
FIG. 6 is a side sectional view illustrating the connection assembly according to a second configuration example.

Next, the connection assembly 42A according to the second configuration example will be described with reference to FIG. 6. FIG. 6 is a side sectional view illustrating the connection assembly 42A according to the second configuration example.

The connection assembly 42A according to the second configuration example differs from the connection assembly 42 according to the first configuration example in that a plurality of intermediate connection members 70 arranged horizontally are covered with one connection substrate 80A. Since the other configuration of the connection assembly 42A is basically the same as the connection assembly 42 according to the first configuration example, the specific description will be omitted. FIG. 6 illustrates the connection assembly 42A in which the connection substrate 80A is stacked on the upper frame portion 71, whereas no connection substrate 80A is stacked on the lower frame portion 72. The connection assembly 42A is not limited to this configuration, and the connection assembly 42A may be disposed only on the lower frame portion 72, or the connection assembly 42A may be disposed on both the upper frame portion 71 and the lower frame portion 72.

The connection substrate 80A extends in the planar direction (horizontal direction) of the upper surface of the pogo frame 41, and is stacked on the upper surface of a plurality of adjacent intermediate connection members 70. The connection substrate 80A has a plurality of vias 821 (via group 82) opposed to the connection pins 731 of each intermediate connection member 70, and a plurality of electronic components 84 opposed to the housing spaces 713. In addition, the connection substrate 80A may have rigidity (non-flexibility) that keeps it from elastically deforming in a state in which the intermediate connection members 70 are stacked.

In a state in which each intermediate connection member 70 and the connection substrate 80A are stacked, the connection assembly 42A constructed as described above can make each electronic component 84 of the connection substrate 80A function while stably being electrically conductive with each tester-side terminal 311 of the tester 30 through the connection substrate 80A. In particular, by stacking the connection substrate 80A on the plurality of intermediate connection members 70, it is possible to reduce the number of components of the connection assembly 42A and promote cost reduction. Although FIG. 6 illustrates a configuration in which one connection substrate 80A is applied to two intermediate connection members 70, the number of intermediate connection members 70 on which one connection substrate 80A is stacked is not particularly limited. For example, the connection assembly 42A may employ one connection substrate 80A that covers the entire upper or lower surface of the pogo frame 41 and can be stacked on all intermediate connection members 70 in the pogo frame 41. It is preferable to provide the pogo frame 41 and the connection substrate 80A with fixing mechanisms (non-illustrated) that enable them to be positioned in place relative to each other to inhibit positional misalignment of the connection substrate 80A relative to each intermediate connection member 70.

Third Configuration Example

Figure 7:
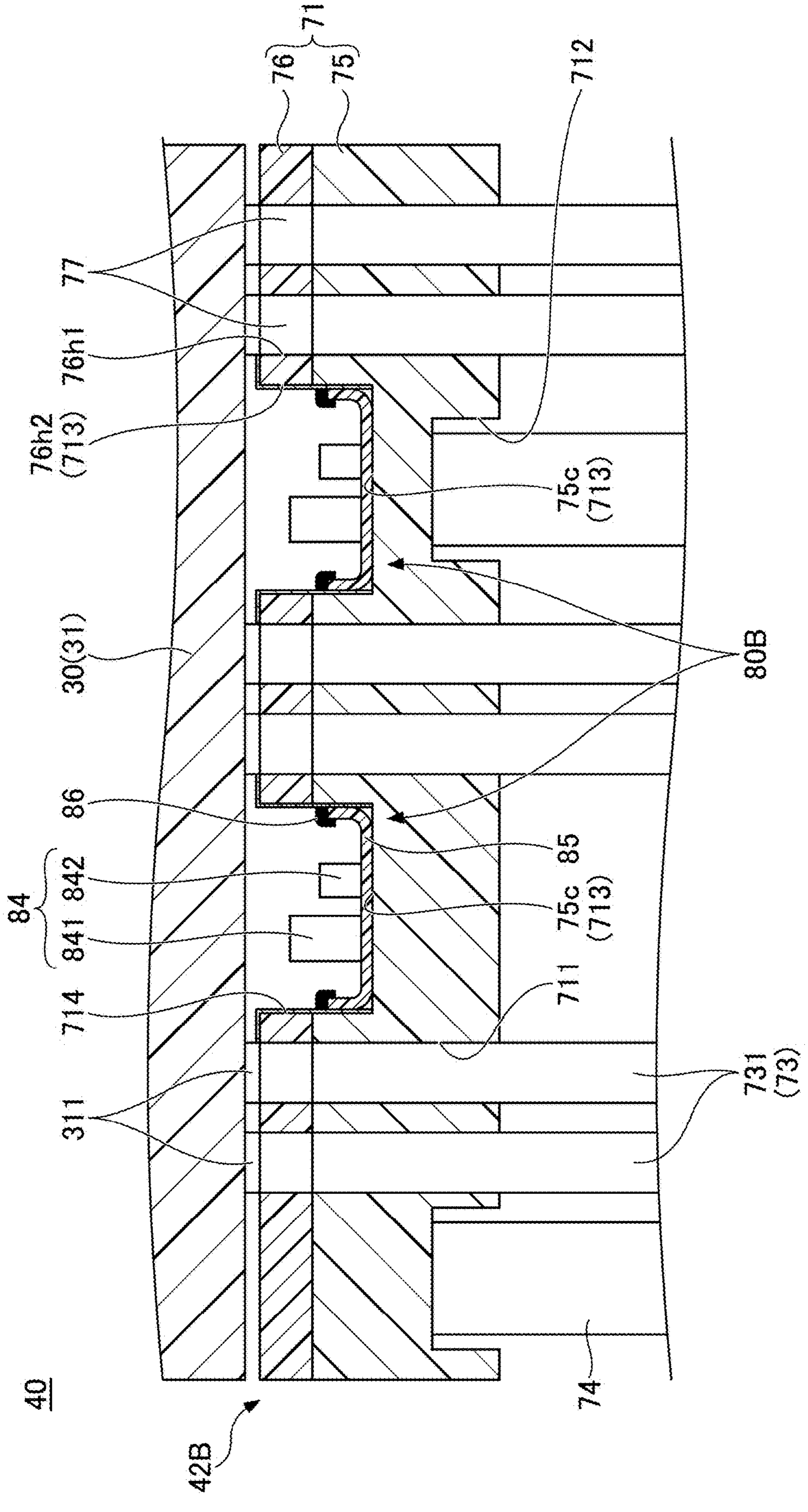
FIG. 7 is an enlarged side sectional view illustrating a part of the connection assembly according to a third configuration example.
Figure 8:
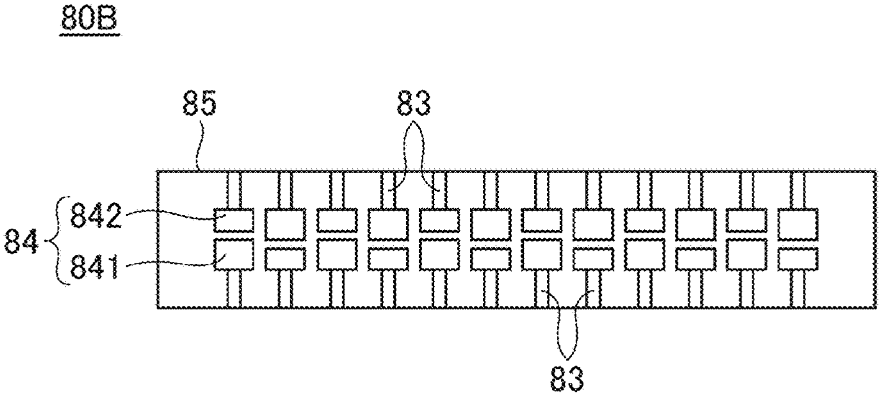
FIG. 8 is a view illustrating an upper surface of the connection substrate according to the third configuration example.

Next, the connection assembly 42B according to the third configuration example will be described with reference to FIGS. 7 and 8. FIG. 7 is an enlarged view of a side section of a part of the connection assembly according to the third configuration example. FIG. 8 is a top view of the connection substrate 80B according to the third configuration example.

The connection assembly 42B according to the third configuration example differs from the connection assemblies 42 and 42A in that the connection substrate 80B itself is housed in each housing space 713 of the intermediate connection member 70. The other configuration of the connection assembly 42B is basically the same as that of the connection assembly 42 according to the first configuration example, and the specific description thereof will be omitted. FIG. 7 illustrates an example in which the connection substrate 80B is applied to the upper frame portion 71, but it should be noted that the connection assembly 42B is not limited to this configuration. For example, in the connection assembly 42B, the connection substrate 80B may be applied only to the lower frame portion 72, or the connection substrate 80B may be applied to both the upper frame portion 71 and the lower frame portion 72.

Each connection substrate 80B includes a flexible sheet body 85, and conductive patterns 83 and electronic components 84 (a bypass capacitor 841, and a termination resistor 842) that are formed on the upper surface of the sheet body 85. The sheet body 85 has a width larger than the width of the bottom surface of each housing space 713 (a recess 75*c* of the main upper frame 75) formed in the upper frame portion 71. The longitudinal dimension of the sheet body 85 may be the same as the longitudinal dimension of each housing space 713. The sheet body 85 thus constructed elastically deforms into a shape in which portions of the sheet body 85 on the widthwise peripheral sides of the electronic components 84 are curved by the side surface of the recess 75*c* while the sheet body 85 is housed on the bottom surface of the recess 75*c*.

The conductive patterns 83 extend from the electronic components 84 in the shorter direction of the sheet body 85 to make the electronic components 84 and contact points on the side edges of the sheet body 85 electrically conductive with each other. The contact points on the side edges of the conductive patterns 83 are electrically connected to a plurality of wires 714 formed in the upper frame portion 71 via joints 86. Solder can be applied as the joints 86, for example.

The wires 714 of the upper frame portion 71 are electrically conductive with the corresponding connection pins 731 via elastic contact-point members 77.

Each electronic component 84 of the connection substrate 80B is provided on the upper surface of the sheet body 85 and is housed in the housing space 713 integrally with the sheet body 85.

Thus, the connection assembly 42B enables the connection substrate 80B to be installed in the housing space 713 without letting each electronic component 84 protrude from the housing space 713. Therefore, the connection assembly 42B enables the tester-side terminals 311 of the tester 30 to be directly connected to the connection pins 731 (including the elastic contact-point member 77) of the intermediate connection member 70 without going through the connection substrate 80B, and can establish a stable connection state.

Fourth Configuration Example

Figure 9A:
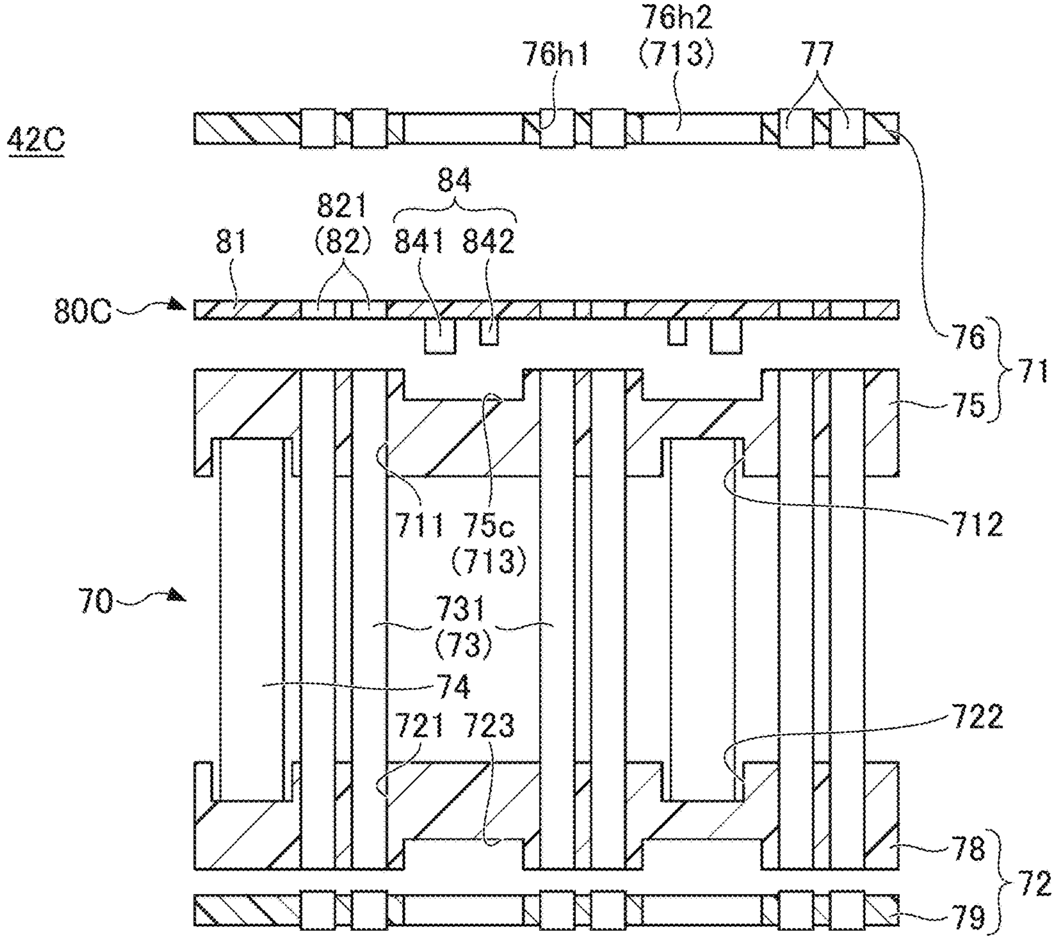
FIG. 9A is a side sectional view illustrating an exploded connection assembly according to a fourth configuration example.
Figure 9B:
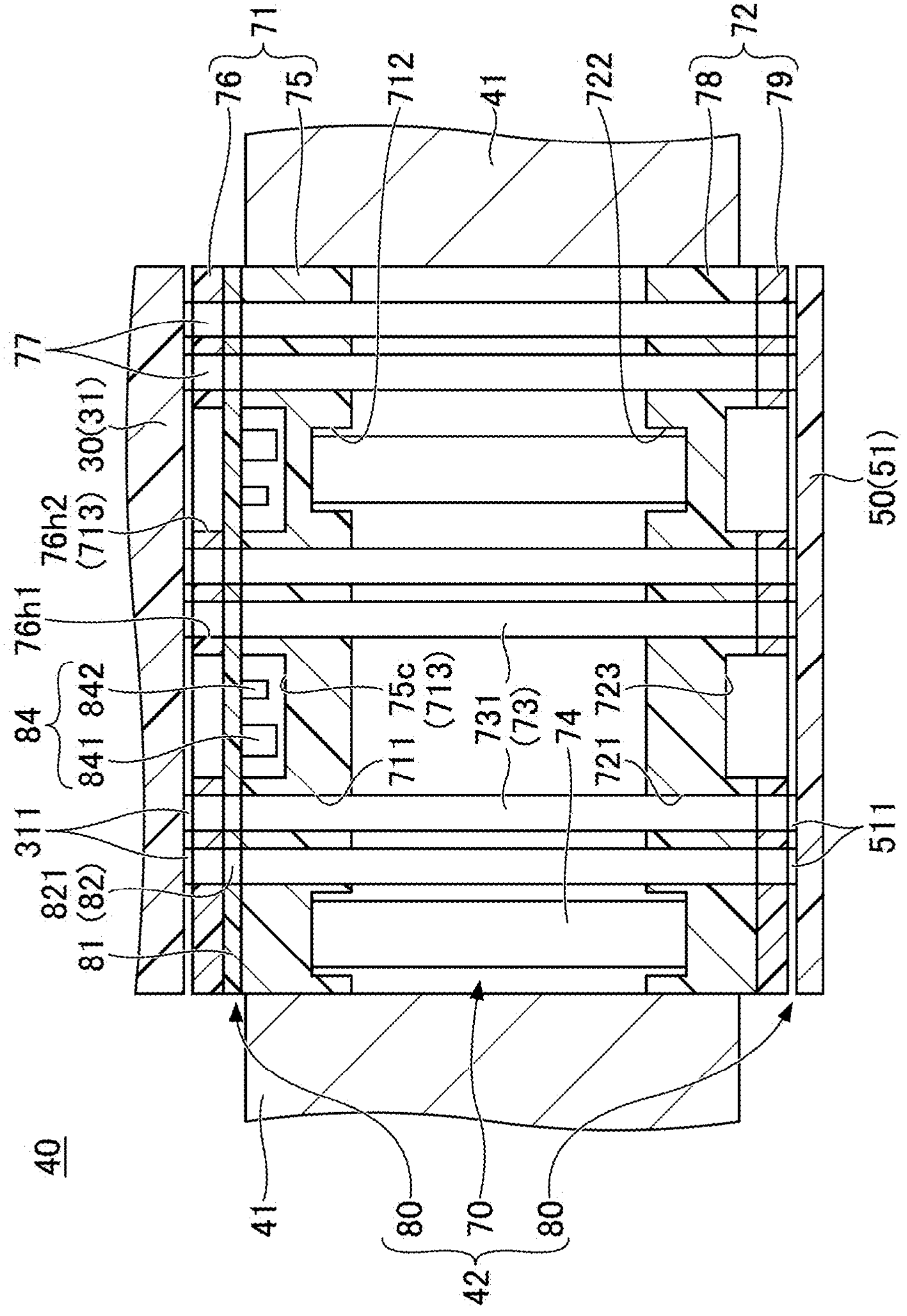
FIG. 9B is a side sectional view illustrating the installation state of the connection assembly according to the fourth configuration example.
Figure 10:
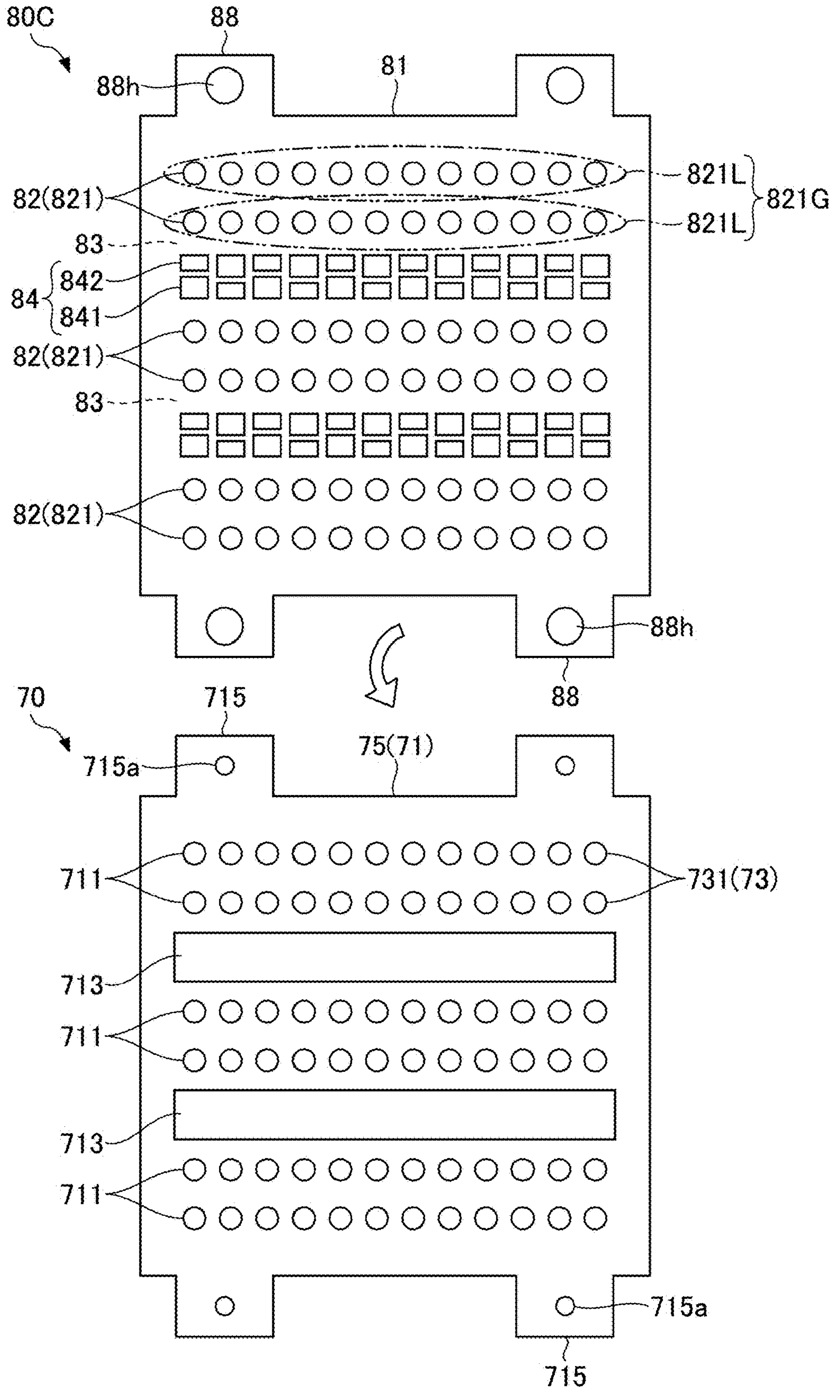
FIG. 10 is a view illustrating assembling of the connection substrate and a main upper frame according to the fourth configuration example.

Next, the connection assembly 42C according to the fourth configuration example will be described with reference to FIGS. 9A, 9B and 10. FIG. 9A is a side sectional view illustrating an exploded connection assembly 42C according to the fourth configuration example. FIG. 9B is a side sectional view illustrating the installation state of the connection assembly 42C according to the fourth configuration example. FIG. 10 is a view illustrating assembling of the connection substrate 80C and the main upper frame 75 according to the fourth configuration example.

The connection assembly 42C according to the fourth configuration example differs from the connection assemblies 42, 42A, and 42B in that the connection substrate 80C is sandwiched between the main upper frame 75 and the sub-upper frame 76. Since the other configuration of the connection assembly 42C is basically the same as the connection assembly 42 according to the first configuration example, the specific description will be omitted. FIGS. 9A and 10 illustrate an example in which the connection substrate 80C is applied to the upper frame portion 71, but the configuration is not limited to this. For example, in the connection assembly 42C, the connection substrate 80 C may be applied only to the lower frame portion 72, or the connection substrate 80C may be applied to both the upper frame portion 71 and the lower frame portion 72.

The connection substrate 80C includes a sheet body 81, a via group 82 (a plurality of vias 821), a conductive pattern 83, and a plurality of electronic components 84, similar to the connection substrate 80 of the first configuration example. The lower end of each via 821 contacts the upper end of a corresponding connection pin 731 exposed to the upper surface of the main upper frame 75. On the other hand, the upper end of each via 821 contacts the lower end (contact point) of the conductive film line of the elastic contact-point member 77 exposed to the lower surface of the sub-upper frame 76.

Each electronic component 84 is mounted on the lower surface side of the sheet body 81 facing the recess 75*c* of the main upper frame 75. Therefore, each electronic component 84 can be set inside the housing space 713 in a state in which the connection substrate 80C is stacked on the upper frame portion 71, and the sheet body 81 can be kept in a flat state. In a case where the protrusion height of the electronic components 84 is smaller than the thickness of the sub-upper frame 76, the electronic components 84 may be provided on the upper surface of the sheet body 81. Thus, the connection assembly 42C can house the electronic components 84 in the second long hole 76*h*2.

The sheet body 81 is formed in approximately the same shape as the upper frame portion 71 and has flexibility. The sheet body 81 suitably deforms according to the shape of the upper surface of the main upper frame 75 and the shape of the lower surface of the sub-upper frame 76, such that it is sandwiched between these frames without any gap. As illustrated in FIG. 10, a plurality of positioning pieces 88 are continuously formed at suitable positions on the outer edge of the sheet body 81. Each positioning piece 88 has a positioning hole 88*h* that is a through-hole in the thickness direction. In contrast, the main upper frame 75 has a plurality of protrusions 715 projecting horizontally outward from sides. A positioning protrusion 715*a* smaller than the positioning hole 88*h* projects on the upper surface of each protrusion 715.

The positioning mechanism such as the positioning hole 88*h* and the positioning protrusion 715*a* is applicable not only to the fourth configuration example, but can also be applied to the first configuration example to the third configuration example. The positioning mechanism is not limited to the hole and the protrusion, and various configurations may be applied.

In the assembling method for assembling the connection assembly 42C, a first step of positioning the connection substrate 80C on the upper surface of the main upper frame 75 and a second step of engaging the main upper frame 75 on which the connection substrate 80C is positioned with the sub-upper frame 76 are carried out in this order.

In the first step, the horizontal direction positioning of the connection substrate 80C with respect to the upper surface of the main upper frame 75 is adjusted so that each positioning protrusion 715*a* of the main upper frame 75 is inserted into a corresponding positioning hole 88*h* of the connection substrate 80C. As a result, each via 821 of the connection substrate 80C faces a corresponding connection pin 731 of the main upper frame 75, and each electronic component 84 faces a corresponding housing space 713. In this state, by the connection substrate 80C being placed on the upper surface of the main upper frame 75, each via 821 contacts a corresponding connection pin 731, and the electronic component 84 is housed in the recess 75*c*.

In the second step, the positioning of the sub-upper frame 76 is adjusted above the main upper frame 75 on which the connection substrate 80C is placed, and the sub-upper frame 76 is mounted on the connection substrate 800 so as to be covered with the sub-upper frame 76. As a result, the connection substrate 80C is sandwiched between the main upper frame 75 and the sub-upper frame 76, and the main upper frame 75 and the sub-upper frame 76 are mutually fixed by their engaging mechanism. That is, the connection assembly 42C is in a state in which the intermediate connection member 70 and the connection substrate 80C are integrated.

In a state in which the frames are integrated, the connection substrate 80C is not displaced relative to the upper frame portion 71. Therefore, the connection assembly 42C can be easily assembled on the pogo frame 41 while the connection assembly 42C stably keeps the electrical connection between the conductive film lines of the connection pins 731, the vias 821, and the elastic contact-point members 77.

The technical concepts and effects of the present disclosure described in the above embodiments will be described below.

A first aspect of the present disclosure is a connection assembly 42, 42A to 42C electrically connecting a plurality of tester-side terminals 311 of a tester 30 and a plurality of probe card-side terminals 511 of a probe card 50, wherein the connection assembly 42, 42A to 42C includes an intermediate connection member 70 and a connection substrate 80, 80A to 80C stacked on the intermediate connection member 70, wherein the intermediate connection member 70 includes: a plurality of connection pins 731 electrically connecting the plurality of tester-side terminals 311 and the plurality of probe card-side terminals 511 with each other, respectively; a first frame portion (upper frame portion 71) holding one end of the plurality of connection pins 731; a second frame portion (lower frame portion 72) holding the other end of the plurality of connection pins 731; and a housing space 713 provided in either or both of the first frame portion and the second frame portion, and wherein the connection substrate 80 is stacked on either or both of the first frame portion and the second frame portion having the housing space 713, and includes a conductive part (a via 821, a conductive pattern 83) electrically connected to the plurality of connection pins 731, and electronic components 84 electrically connected to the conductive part and disposed in the housing space 713.

According to the foregoing, the connection assembly 42, 42A to 42C enables easy and accurate mounting of the electronic component 84 on the flat connection substrate 80, 80A to 80C, thereby allowing the probe card 50 to be stably replaced and used. In addition, recycled use of the electronic components 84 of the connection substrate 80, 80A to 80C is easy in, for example, replacement of the probe card 50, thereby reducing the cost associated with use of the tester 30. In particular, since the electronic component 84 is disposed in the housing space 713, it is easy to stack the connection substrate 80, 80A to 80C on the intermediate connection member 70, and the connection assembly 42, 42A to 42C can well construct the electrical connection with the tester 30 and the probe card 50.

The connection substrate 80 is either placed on the surface of the first frame portion (upper frame portion 71) and sandwiched between the first frame portion and the tester 30, or placed on the surface of the second frame portion (lower frame portion 72) and sandwiched between the second frame portion and the probe card 50, or both. Thus, the connection assembly 42 allows easy stacking of the connection substrate 80 on the intermediate connection member 70.

The connection substrate 80A extends over the plurality of intermediate connection members 70, and electronic components 84 are disposed in each of the housing spaces 713 of the plurality of intermediate connection members 70. Thus, the connection assembly 42A allows disposing of the electronic components 84 on the plurality of intermediate connection members 70 while reducing the number of connection substrates 80A.

The housing space 713 has a recess 75*c* provided in either or both of the first frame portion (upper frame portion 71) and the second frame portion (lower frame portion 72), and the connection substrate 80 is housed in the recess 75*c*. Thus, the connection assembly 42B can further promote miniaturization by housing the entirety of the connection substrate 80B including the electronic components 84 in the recess 75*c*.

The conductive part (conductive pattern 83) of the connection substrate 80B is electrically connected to the wire 714 provided in the recess 75*c* through the joint 86 having conductivity. Thus, the connection substrate 80B can stably connect the conductive patterns 83 and the electronic components 84 to the plurality of connection pins 731.

Either or both the first frame portion (upper frame portion 71) and the second frame portion (lower frame portion 72) can be separated into a first part (main upper frame 75) and a second part (sub-upper frame 76), and the connection substrate 80C is sandwiched between the first part and the second part. Thereby, the connection assembly 42C can prevent the positional misalignment of the connection substrate 80C with respect to either or both of the first frame portion and the second frame portion.

Further, the first part (main upper frame 75) holds a plurality of connection pins 731, and the second part (sub-upper frame 76) has contact points (contact points of the elastic contact-point members 77) to be electrically connected to the plurality of connection pins 731 through the conductive part (via 821) of the connection substrate 80C. Thus, the connection assembly 42C can provide a good connection between the first part, the connection substrate 80C, and the second part.

The electronic component 84 is provided on one surface of the connection substrate 80C and is housed in the housing space 713 (recess 75*c*) of the first part (main upper frame 75). Thereby, the connection assembly 42C can make the second part as thin as possible, and the miniaturization of the entirety can be further promoted.

Further, the connection substrate 80, 80A to 80C is formed in a sheet shape having flexibility. Thus, in the connection assembly 42, 42A to 42C, the electronic components 84 can be easily set on the intermediate connection member 70 along with deformation of the connection substrate 80, 80A to 80C.

Further, the connection substrate 80, 80 A to 80 C has a plurality of positioning holes 88 *h*, and either or both of the first frame portion (upper frame portion 71) and the second frame portion (lower frame portion 72) on which the connection substrate 80, 80A to 80C is stacked have a plurality of positioning protrusions 715*a* to be inserted into the plurality of positioning holes 88*h*. Thus, the connection assembly 42, 42A to 42C enables easy positioning of the connection substrate 80, 80A to 80C with respect to the intermediate connection member 70, thereby stabilizing electrical connection.

Either or both of the first frame portion (upper frame portion 71) and the second frame portion (lower frame portion 72) can be separated into a plurality of parts, and of the plurality of parts, either or both of parts (sub-upper frame 76 and sub-lower frame 79) adjoining the plurality of tester-side terminals 311 and the plurality of probe card-side terminals 511 are provided with elastically deformable elastic contact-point members 77 having contact points to be electrically connected to the plurality of connection pins 731. Thus, all of the connection pins 731, the tester-side terminals 311, and the probe card-side terminals 511 can be flexibly brought into contact with each other along with elastic deformation of the elastic contact-point members 77.

The conductive part has a plurality of vias 821 penetrating the connection substrate 80, 80A to 80C in the thickness direction and contacting the plurality of connection pins 731 respectively, and conductive patterns 83 electrically connecting the vias 821 and the electronic components 84. Thus, the connection assembly 42, 42A, and 42C can provide smooth electrical connection with the electronic components 84 through the vias 821 and the conductive patterns 83 of the connection substrate 80, 80A, and 80C.

The electronic components 84 include a bypass capacitor 841. Thus, the connection assembly 42, 42A to 42C enables effective recycled use of the bypass capacitor 841 even in replacement of the probe card 50.

A second aspect of the present disclosure is an inspection device 20: including a tester 30 including a plurality of tester-side terminals 311; a probe card 50 including a plurality of probes 52 to be brought into contact with a substrate (wafer W), and a plurality of probe card-side terminals 511 electrically connected to the plurality of probes 52; and a connection assembly 42, 42A to 42C configured to electrically connect the plurality of tester-side terminals 311 and the plurality of probe card-side terminals 511, wherein the connection assembly 42, 42A to 42C includes an intermediate connection member 70 and a connection substrate 80, 80A to 80C stacked on the intermediate connection member 70, wherein the intermediate connection member 70 includes a plurality of connection pins 731 configured to electrically connect the plurality of tester-side terminals 311 and the plurality of probe card-side terminals 511 respectively, a first frame portion (upper frame portion 71) configured to hold one end of the plurality of connection pins 731, a second frame portion (lower frame portion 72) configured to hold other end of the plurality of connection pins 731, and a housing space 713, 723 provided in either or both of the first frame portion and the second frame portion, and wherein the connection substrate 80, 80A to 80C is stacked on either or both of the first frame portion and the second frame portion having the housing space 713, 723, and includes a conductive part (a via 821, and a conductive pattern 83) electrically connected to the plurality of connection pins 731, and an electronic component 84 electrically connected to the conductive part and disposed in the housing space 713. Also in this case, application of an easily and accurately mounted electronic component 84 to the inspection device 20 is possible, thereby enabling the probe card 50 to be stably replaced and used.

The connection assembly 42, 42A to 42C, and the inspection device 20 according to the embodiments disclosed herein are exemplary in all respects and are not restrictive. Embodiments may be modified and improved in various forms without departing from the scope and spirit of the appended claims. The matters described in the foregoing plurality of embodiments may be in any other forms to the extent that they are consistent, and may be combined to the extent that they are consistent.

This application claims priority to a basic application No. 2022-198898, filed with the Japanese Patent Office on Dec. 13, 2022, the entire contents of which are incorporated herein by reference.

REFERENCE SIGNS LIST

20 inspection device
30 tester
311 tester-side terminal
42, 42A to 42C connection assembly
50 probe card
511 probe card-side terminal
70 intermediate connection member
71 upper frame portion
713 housing space
72 lower frame portion
731 connection pin
80 connection substrate
821 via
83 conductive pattern
84 electronic component

The invention claimed is:

1. A connection assembly configured to electrically connect a plurality of tester-side terminals of a tester and a plurality of probe card-side terminals of a probe card, the connection assembly comprising:
an intermediate connection member; and
a connection substrate stacked on the intermediate connection member,
wherein the intermediate connection member comprises:
a plurality of connection pins configured to electrically connect the plurality of tester-side terminals and the plurality of probe card-side terminals;
a first frame portion configured to hold one end of each of the plurality of connection pins;
a second frame portion configured to hold the other end of each of the plurality of connection pins; and
a housing space provided in either or both of the first frame portion and the second frame portion, and
the connection substrate is stacked on either or both of the first frame portion and the second frame portion having the housing space, and comprises:
a conductive part electrically connected to the plurality of connection pins; and
an electronic component electrically connected to the conductive part and disposed in the housing space.

2. The connection assembly of claim 1,
wherein the connection substrate is placed on a surface of the first frame portion and sandwiched between the first frame portion and the tester, or
the connection substrate is placed on a surface of the second frame portion and sandwiched between the second frame portion and the probe card, or
the connection substrate is placed on the surface of the first frame portion and sandwiched between the first frame portion and the tester and is placed on the surface of the second frame portion and sandwiched between the second frame portion and the probe card.

3. The connection assembly of claim 2,
wherein the connection substrate extends over a plurality of intermediate connection members, such that the electronic component is disposed in the housing space of each of the plurality of the intermediate connection members, wherein each of the plurality of intermediate connection members is the intermediate connection member.

4. The connection assembly of claim 1,
wherein the housing space has a recess provided in either or both of the first frame portion and the second frame portion, and
the connection substrate is housed in the recess.

5. The connection assembly of claim 4,
wherein the conductive part of the connection substrate is electrically connected to a wiring provided in the recess through a conductive joint.

6. The connection assembly of claim 1,
wherein either or both of the first frame portion and the second frame portion are separable into a first part and a second part, and
the connection substrate is sandwiched between the first part and the second part.

7. The connection assembly of claim 6,
wherein the first part holds the plurality of connection pins, and
the second part has contact points electrically connected to the plurality of connection pins through the conductive part of the connection substrate.

8. The connection assembly of claim 7, wherein the electronic component is provided on one surface of the connection substrate and is housed in the housing space of the first part.

9. The connection assembly of claim 1, wherein the connection substrate is formed in a sheet shape having flexibility.

10. The connection assembly of claim 1, wherein the connection substrate has a plurality of positioning holes, and either or both of the first frame portion and the second frame portion on which the connection substrate is stacked have a plurality of positioning protrusions to be inserted into the plurality of positioning holes, respectively.

11. The connection assembly of claim 1, wherein either or both of the first frame portion and the second frame portion are separable into a plurality of parts, and of the plurality of parts, either or both of parts adjoining the plurality of tester-side terminals and the plurality of probe card-side terminals are provided with elastically deformable elastic contact-point members having contact points to be electrically connected to the plurality of connection pins.

12. The connection assembly of claim 1, wherein the conductive part comprises:

a plurality of vias penetrating the connection substrate in a thickness direction and contacting the plurality of connection pins, respectively; and a conductive pattern electrically connecting the vias and the electronic component.

13. The connection assembly of claim 1, wherein the electronic component comprises a bypass capacitor.

14. An inspection device, comprising:

a tester including a plurality of tester-side terminals;

a probe card having a plurality of probes to be brought into contact with a substrate and a plurality of probe card-side terminals electrically connected to the plurality of probes; and a connection assembly configured to electrically connect the plurality of tester-side terminals and the plurality of probe card-side terminals, wherein the connection assembly comprises an intermediate connection member and a connection substrate stacked on the intermediate connection member, the intermediate connection member comprises:

a plurality of connection pins configured to electrically connect the plurality of tester-side terminals and the plurality of probe card-side terminals, respectively;

a first frame portion configured to hold one end of each of the plurality of connection pins;

a second frame portion configured to hold the other end of each of the plurality of connection pins; and a housing space provided in either or both of the first frame portion and the second frame portion, and the connection substrate is stacked on either or both of the first frame portion and the second frame portion having the housing space, and comprises:

a conductive part electrically connected to the plurality of connection pins; and an electronic component electrically connected to the conductive part and disposed in the housing space.

* * * * *